(12) United States Patent
Hsu et al.

(10) Patent No.: US 7,216,284 B2
(45) Date of Patent: May 8, 2007

(54) CONTENT ADDRESSABLE MEMORY HAVING REDUCED POWER CONSUMPTION

(75) Inventors: Louis L. Hsu, Fishkill, NY (US); Brian L. Ji, Fishkill, NY (US); Li-Kong Wang, Montvale, NY (US)

(73) Assignee: International Business Machines Corp., Armonk, NY (US)

( * ) Notice: Subject to any disclaimer, the term of this patent is extended or adjusted under 35 U.S.C. 154(b) by 747 days.

(21) Appl. No.: 10/145,018

(22) Filed: May 15, 2002

(65) Prior Publication Data

US 2003/0217321 A1 Nov. 20, 2003

(51) Int. Cl.
*G11C 29/00* (2006.01)
(52) U.S. Cl. .................. 714/766; 714/763; 714/768
(58) Field of Classification Search .......... 714/722, 714/780, 805, 705, 766, 763, 768; 326/35; 365/49
See application file for complete search history.

(56) References Cited

U.S. PATENT DOCUMENTS

| | | | |
|---|---|---|---|
| 4,755,974 A * | 7/1988 | Yamada et al. | 365/49 |
| 5,043,943 A * | 8/1991 | Crisp et al. | 365/189.01 |
| 5,053,991 A * | 10/1991 | Burrows | 365/49 |
| 5,111,427 A * | 5/1992 | Kobayashi et al. | 365/185.07 |
| 5,130,945 A * | 7/1992 | Hamamoto et al. | 365/49 |
| 5,233,610 A * | 8/1993 | Nakayama et al. | 714/704 |
| 5,245,617 A * | 9/1993 | DeSouza et al. | 714/766 |
| 5,258,946 A * | 11/1993 | Graf | 365/49 |
| 5,311,462 A * | 5/1994 | Wells | 365/49 |
| 5,491,703 A * | 2/1996 | Barnaby et al. | 714/766 |
| 5,796,758 A * | 8/1998 | Levitan | 714/800 |

OTHER PUBLICATIONS

Yamagata, T., Mihara, M., Hamamoto, T., Murai, Y., Kobayashi, T., Yamada, M. and Ozaki, H., "A 288-kb Fully Parallel Content Addressable Memory Using a Stacked-Capacitor Cell Structure" *IEEE Journal of Solid State Circuits*, vol. 27, No. 12, (Dec. 1992), pp. 1927-1933.

Shafai, F., Schultz, K. J., Gibson, G.F.R., Bluschke, A. G., and Somppl, D. E., "Fully Parallel 30-MHz, 2.5-Mb CAM" *IEEE Journal of Solid State Circuits*, vol. 33, No. 11, (Nov. 1998), pp. 1690-1696.

Application Brief AB-N6, "What is a CAM (Content-Addressable Memory)?" MUSIC Semiconductors, (Sep. 1998) Rev. 2A.

Steven A. Guccione, Deion Levi and Daniel Downs. "A Reconfigurable Content Addressable Memory" In Jose Rodim et al. editors, *Parallel and Distributed Processing*, pp. 882-889. Springer-Verlag, Berlin, May 2000. Proceedings of the 15th International Parallel and Distributed Processing Workshops, IPDPS 2000.

* cited by examiner

*Primary Examiner*—Albert Decady
*Assistant Examiner*—Mujtaba Chaudry
(74) *Attorney, Agent, or Firm*—Law Office of Charles W. Peterson, Jr.; Louis J. Percello, Esq.; Satheesh K. Karra, Esq.

(57) ABSTRACT

A content addressable memory (CAM). A data portion of the CAM array includes word data storage. Each word line includes CAM cells (dynamic or static) in the data portion and a common word match line. An error correction (e.g., parity) portion of the CAM array contains error correction cells for each word line. Error correction cells at each word line are connected to an error correction match line. A match on an error correction match line enables precharging a corresponding data match line. Only data on word lines with a corresponding match on an error correction match line are included in a data compare. Precharge power is required only for a fraction (inversely exponentially proportional to the bit length of error correction employed) of the full array.

20 Claims, 5 Drawing Sheets

CONTENT ADDRESSABLE MEMORY HAVING REDUCED POWER CONSUMPTION

BACKGROUND OF THE INVENTION

Field of the Invention

The present invention is related to content addressable memories (CAM) or associated memories and more particularly to reducing array power and a cell for reducing array power in a content addressable memory.

Random access memories (RAMs) are well known in the art. A typical RAM has a memory array wherein every location is addressable and, freely accessible by providing the correct corresponding address. Typical RAMs include both static RAMs (SRAMs) and dynamic RAMs (DRAMs). A typical six device insulated gate complementary field effect transistor (FET) SRAM cell, formed in the technology commonly referred to as CMOS, is a pair of cross coupled invertors with a pass gate transistor between each side of the cross coupled invertors and each of a pair of complementary bit lines. The cross coupled invertors hold whatever is stored in the cell as long as a supply voltage is provided to the memory array. A typical DRAM cell is just a storage capacitor and a pass gate or select transistor between a bit line and the storage capacitor. The DRAM cell only holds whatever is stored on the capacitor for a short period of time because of inherent cell. So, DRAMs are refreshed periodically to extend that time and maintain whatever is stored in the array.

Content addressable memories (CAMs) are well known in the art. A typical CAM has two modes of operation. In one mode of operation the CAM acts as a random access memory, accepting an address for a particular location in the memory and providing read/write access to that address. In a second content addressable or search mode, array locations are identified by and selected by what the locations contain. A particular identifying value, typically called a Comparand is provided, and comparing array contents to the Comparand the array is searched for a match. Thus, storing a databases, a list or other types of data in a CAM can facilitate a fast search. A typical CAM interrogates the entire CAM array in parallel in match mode.

By contrast, searching through data stored in a SRAM or DRAM requires using a binary location by location search, a tree based search algorithm or a look aside tag buffer. The search information must be compared against the entire list of prestored entries in the RAM. These types of searches require serially accessing RAM contents until the contents match the desired information. As would be expected, searching through data in a CAM has a significant performance advantage over typical state of the art RAMs, whether SRAMs or DRAMs.

In particular, CAMs have application in database machines, for image or voice recognition or, in managing computer and communication networks. For example, storing network addresses in a CAM provides a fast lookup table for a network address resolution and has application in switches, bridges and routers, e.g., ATM switches, layer three switches, or in a gigabit Ethernet local area network (LAN). CAMs can provide a significant speed advantage for such a fast look up table, especially for higher speed communications networks, i.e., ranging at 10 Gigabits per second (Gbps) to 40 Gbps, where address resolution must complete in 10 nanoseconds (ns) or less.

Like RAMs, CAMs also may be characterized as static or dynamic. CAM cells are similar to RAM cells but with the inclusion of a compare function (e.g., EXclusive OR (EXOR) or equivalent) to compare the cells' contents with corresponding Comparand bits. The comparison results for individual cells for each word are combined at a match line to provide a final match value. These individual bit compare values may be combined using any one of a number of logic functions, e.g., AND, OR, wired AND or wired OR.

A CAM search begins by pre-charging the match lines high. The Comparand value is provided as an input individual, Comparand bits being provided to the individual EXOR's for each of the cells in the array, typically by biasing array bit lines appropriately. Of all the compare locations in the array, any with a match that remain high after the search are locations that contain a matching value. Both for performance and power considerations, typically, these match lines are dynamic, precharged high and floated during the comparison. Power is expended precharging the match lines high. The power required just for precharging is a function of match line capacitance ($C_{ML}$), precharge voltage ($V_{pre}$) and, the frequency (f) with which the match lines are precharged. Thus, for a high speed CAM, precharge power ($\sim fC_{ML}V_{pre}^2$) can become excessive. So, at 10–40 Gbps the power requirements for a state of the art CAM may be such as to make it unuseable.

In addition to requiring unacceptable chip power, precharging the match lines quickly enough for these high speed (10 ns) applications may be difficult both because of the capacitive load of the match lines and transient currents that may be necessary to precharge the load. Large transient current spikes can manifest as sensitivity to parasitic inductance and resistance in the supply lines. The transient current spikes can cause corresponding voltage spikes across these parasitics that impairs the CAM operation (e.g., causing a brown out) and, further degrades CAM performance, in particular during match line precharge.

Thus, there is a need for a CAM array with reduced precharge requirements and in particular reduced precharge current requirements.

SUMMARY OF THE INVENTION

It is a purpose of the invention to reduce CAM power requirements;

It is another purpose of the invention to reduce CAM power requirements without significantly impacting CAM search performance.

The present invention is a content addressable memory (CAM). A data portion of the CAM array includes word data storage. Each word line includes CAM cells (dynamic or static) in the data portion and a common word match line. An error correction (e.g., parity) portion of the CAM array contains error correction cells for each word line. Error correction cells at each word line are connected to an error correction match line. A match on an error correction match line enables precharging a corresponding data match line. Only data on word lines with a corresponding match on an error correction match line are included in a data compare. Precharge power is required only for a fraction (inversely exponentially proportional to the bit length of error correction employed) of the full array.

BRIEF DESCRIPTION OF THE DRAWINGS

The foregoing and other objects, aspects and advantages will be better understood from the following detailed preferred embodiment description with reference to the drawings, in which.

DESCRIPTION OF THE PREFERRED EMBODIMENT

Figure 1A:
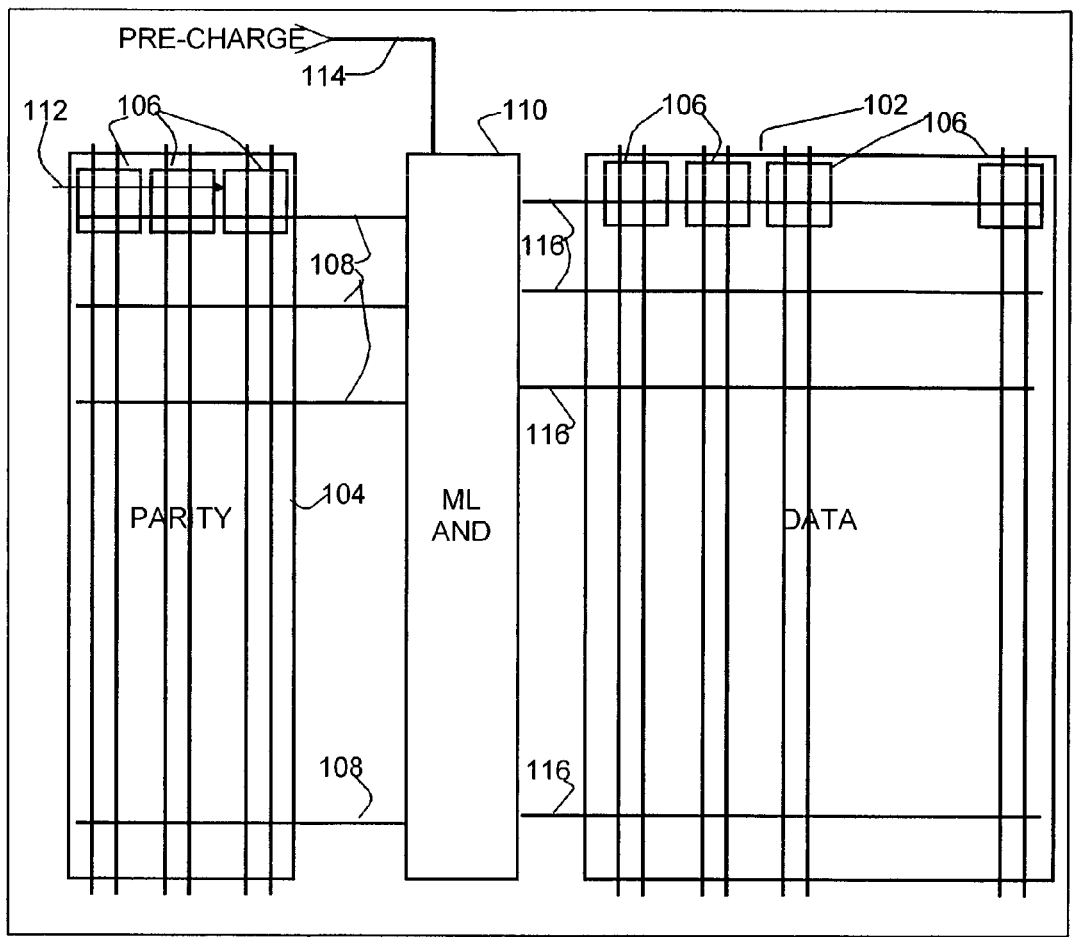
FIGS. 1A–B show an example of a cross section of a first preferred embodiment CAM array and CAM array.
Figure 1B:
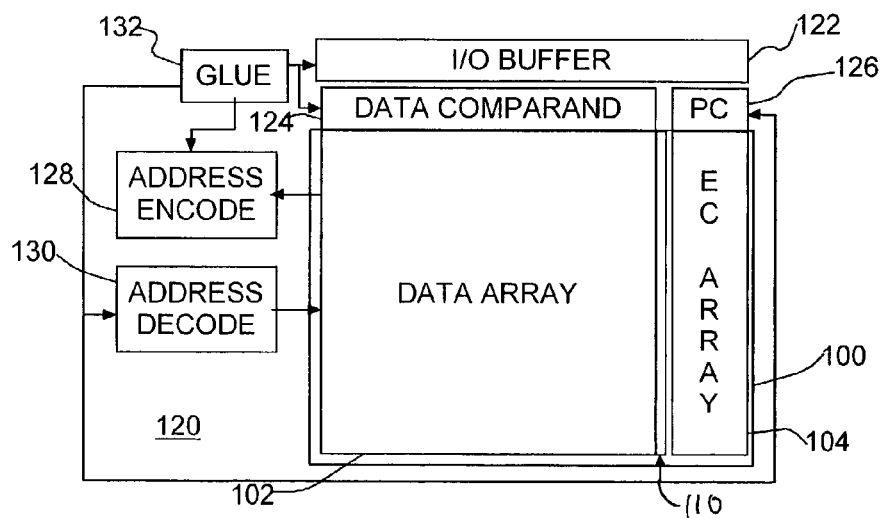

Turning now to the drawings and more particularly FIGS. 1A–B show an example of a cross section of a first preferred embodiment CAM array and a CAM including the CAM array, which performs a hierarchical search thereby reducing CAM power and current requirements.

In particular, the CAM array 100 in FIG. 1A includes a data storage area 102 and an error correction area 104. The error correction area 104 stores typical standard error correction code (ECC, e.g., parity) for each data location. Preferably, cells 106 in both areas 102, 104 are substantially identical. Each of the error correction match lines 108 from cells 106 in error correction area 104 are an input to a corresponding AND gate in area 110. A separate control line 112 enables a compare or search in the error correction section 104. Precharge control line 114 is a second input to all AND gates 110, where it is AND'ed with each of the error correction match lines 108. The output of each AND gate from area 110 is an individual precharge data match line 116 to cells 106 at the corresponding data/word locations of data area 102. In an initial compare, only the ECC bits for the Comparand are compared against stored contents in the error correction portion of the array 104, preselecting for a data compare only locations with ECC contents matching Comparand ECC bits.

FIG. 1B shows an example of a CAM 120 including the CAM array 100 of FIG. 1A. Data to/from the CAM 120, including Comparands for searching, pass through a data I/O register 122. Appropriate portions of each Comparand are passed to Comparand data register 124 and Comparand parity register 126. Match lines from data area 102 are passed to Address Encode 128. Address Decode 130 selects CAM locations in random access mode for both data area 102 and parity area 104. Glue logic 132 provides necessary timing and control.

So, for any compare, Comparand error correction bits, parity bits in this example, are provided to corresponding bit line pairs in the error correction area 104, and error correction match lines 108 are driven to a pre-compare state. Then, control line 112 is driven to enable comparison in the error correction portion 104. Error correction Comparand bits are provided to error correction section 104 from Comparand error correction or parity register 126. It is expected that for k parity bits $\frac{1}{2^k}$ or j of n stored words will match on the average, regardless of error correction scheme. Thus, for those j words, the error correction match lines 108 each provide a high ("1") input to a corresponding AND gate in area 112. When precharge control line 114 is driven high, the output of each corresponding AND gate in area 112 goes high, precharging the data match line 114 for those j words.

Thus, when the Comparand data bits are provided to data storage area 102 bit lines, a match can only occur in those j lines and, whichever of the j lines containing the matching value remain high.

So, only for those j locations where the Comparand error correction bits match are the data bits compared to determine if those locations contain a match. Thus, this hierarchical compare reduces the precharge power significantly over prior art CAMs. For example, a preferred embodiment array with one parity bit for each 32 bits of a 128 bit location (i.e., k=4 and j=16) should use only $\frac{1}{16}$ the power required for a comparable prior art CAM. This is because for any Comparand on the average, a matching parity value will occur at only 1 in 16 of each of the word locations, i.e., locations containing the corresponding one of 16 possible combinations of the four parity bits.

Figure 2:
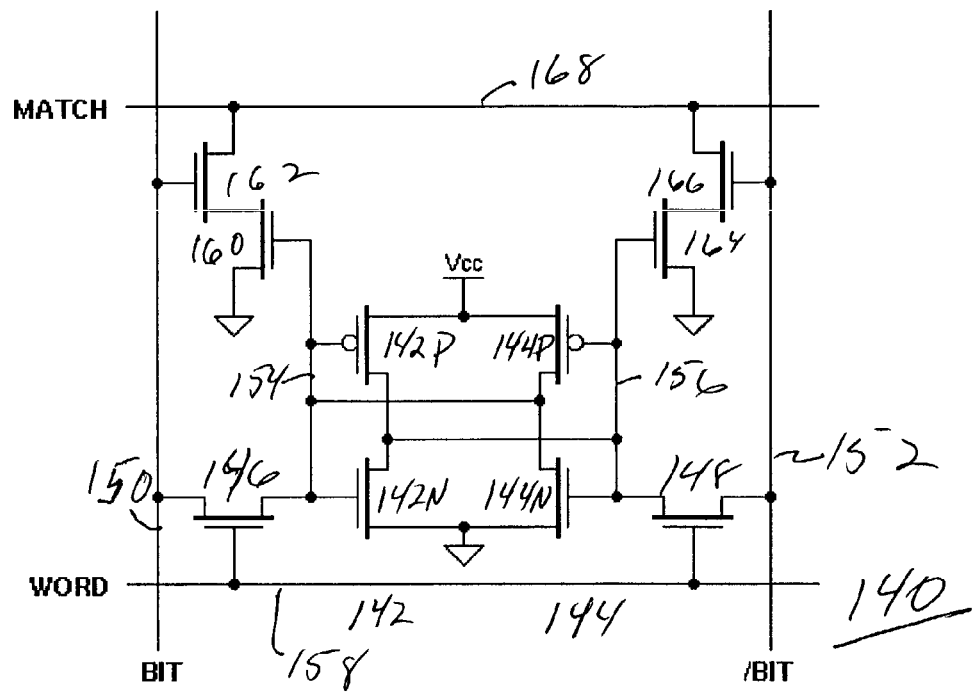
FIG. 2 is an example of a static CAM (SCAM) cell for a preferred embodiment SCAM corresponding to cells in FIG. 1A.

FIG. 2 is an example of a static CAM (SCAM) cell 140 for a preferred embodiment SCAM corresponding to cells 106 in FIG. 1A. It should be noted that for a static CAM, control line 120 in the example of FIG. 1A may be omitted with that control being effected by controlling the timing relationship between match error correction match lines 108 and providing Comparand error correction bits to the error correction array 104. The SCAM cell 140 includes a pair of cross coupled invertors 142, 144 each including an N-type FET (NFET) 142N, 144N and P-type FET (PFET) 142P, 144P. As with any typical SRAM cell, a pair of pass gates 146, 148 are connected between complementary bit line pair 150, 152 and the storage nodes 154, 156 of the cross coupled invertors 142, 144. Pass gates 146, 148 are gated by word line 158. In addition, each of the complementary bit line pair 150, 152 are NANDed with a corresponding one of the storage nodes 154, 156 by series connected NFETs 160, 162 and 164, 166, respectively, which compare the cell's contents with the state of the bit line pair 150, 152. The series connected compare NFETs 160, 162 and 164, 166 are connected between ground and the match line 168 and dot NORed at the match line 168.

As with any state of the art SRAM cell, data is stored in the static CAM cell 140 by placing an appropriate level on each of the complementary bit lines 150, 152 and driving the word line 158 high. As noted above, the contents of the cell 140 may be interrogated (i.e., searched) by driving the match line 168 high (i.e., precharging it) and then, placing an inverted Comparand bit value on each of the bit line pair 150, 152. If the complemented voltage levels on the bit line pair 150, 152 match the cell contents, then the inverted Comparand bit does not match the stored bit contents. Thus, with bit line pair 150, 152 matching storage nodes 154, 156, respectively, both of one pair of compare NFETs 160, 162 or 164, 166 are on, providing a path to ground for the match line 168 and the cell 140 pulls the match line 168 low. Otherwise, the cell 140 does not provide a path to ground and the match line 168 may remain high, provided no other cell on the same match line 168 pulls it low.

Figure 3:
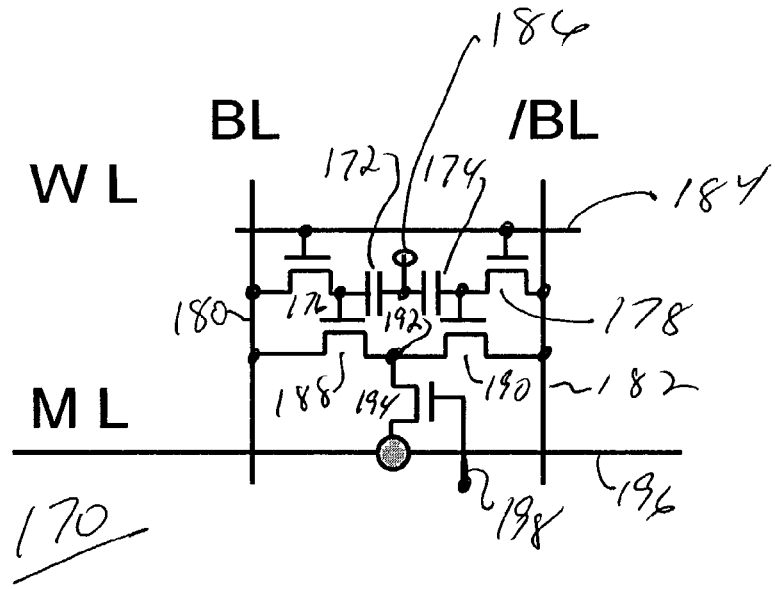
FIG. 3 shows an example of a dynamic CAM (DCAM) cell for a preferred embodiment dynamic CAM corresponding to cells.

FIG. 3 shows an example of a dynamic CAM (DCAM) cell 170 for a preferred embodiment dynamic CAM corresponding to cells 106 in FIG. 1A. The preferred embodiment DCAM cell 170 includes, essentially, a pair of back-to-back dynamic RAM cells, each including a storage capacitor 172, 174 and a pass gate (NFETs 176, 178) between the storage capacitor 172, 174 and a corresponding one of a complementary bit line pair 180, 182. As with any DRAM cell, a word line 184 controls the gate of each of the pass gates 176, 178. A reference voltage (e.g., ground (GND)) is applied at a common connection 186 of the two storage capacitors 172, 174. A pair of compare devices (NFETs 188, 190) are connected between a common match node 192 and a corresponding one of the bit line pair 180, 182. The gate of each of the compare devices 188, 190 are connected to a corresponding storage capacitor 172, 174 at the pass gate 176, 178. A match device (PFET 194) is connected between match node 192 and match line 196. If the cell 170 is included in the error correction area 104, then the gate 198 of match device 194 is driven by separate control line 116 in FIG. 1. Otherwise, in the data area 102, the gate 198 of match device 194 also is tied to match line 196. The separate control line in 116 in FIG. 1 controls another precharge transistor (not shown) which precharges the match line in the parity cell array 102 to a selected precharge level, e.g., ground or supply voltage $V_{dd}$.

So, for a typical preferred embodiment CAM as shown in the example of FIG. 2 with dynamic cells of the example of FIG. 3, there are three major CAM operations: a write operation; a refresh and a search. The write operation is substantially similar to any write operation in any state of the art DRAM or dynamic CAM. The CAM is loaded with data by writing word by word in random access mode. In any write or load, a first address may be provided to the address decode 130 as data is stored in the data register 122. Typically, the address is a first location for a block of data, e.g., a lock of 8 k words. For example, each word may contain four bytes plus parity, i.e., 32 bits plus 4 parity bits. So, for this example the entire CAM word is 36 bits wide. Both data and parity are stored simultaneously in their respective array areas 102, 104, similar to storing data in any dynamic RAM, as is well known in the art.

As noted hereinabove, DRAM must be refreshed periodically to maintain data in the array beyond a maximum cell retention rate. Essentially, each time a word line is read data at that word line data is refreshed. Accordingly, a refresh amounts to accessing each and every word line periodically. When the word line is driven high, the cell contents are passed to the bit line pairs as a voltage difference between each bit line pair. Typically, that difference is amplified by a sense amplifier, driving one of each bit line pair high and the other low to reinforce the voltage level on the cell storage capacitors, essentially re-writing the contents of a location back into the cell. Then, the word line is pulled low, turning off and deselecting the cells on the refresh word line. As a result, the voltage levels in the cell have been refreshed to their stored levels. Refresh cycles are well known in the art.

Figure 4:
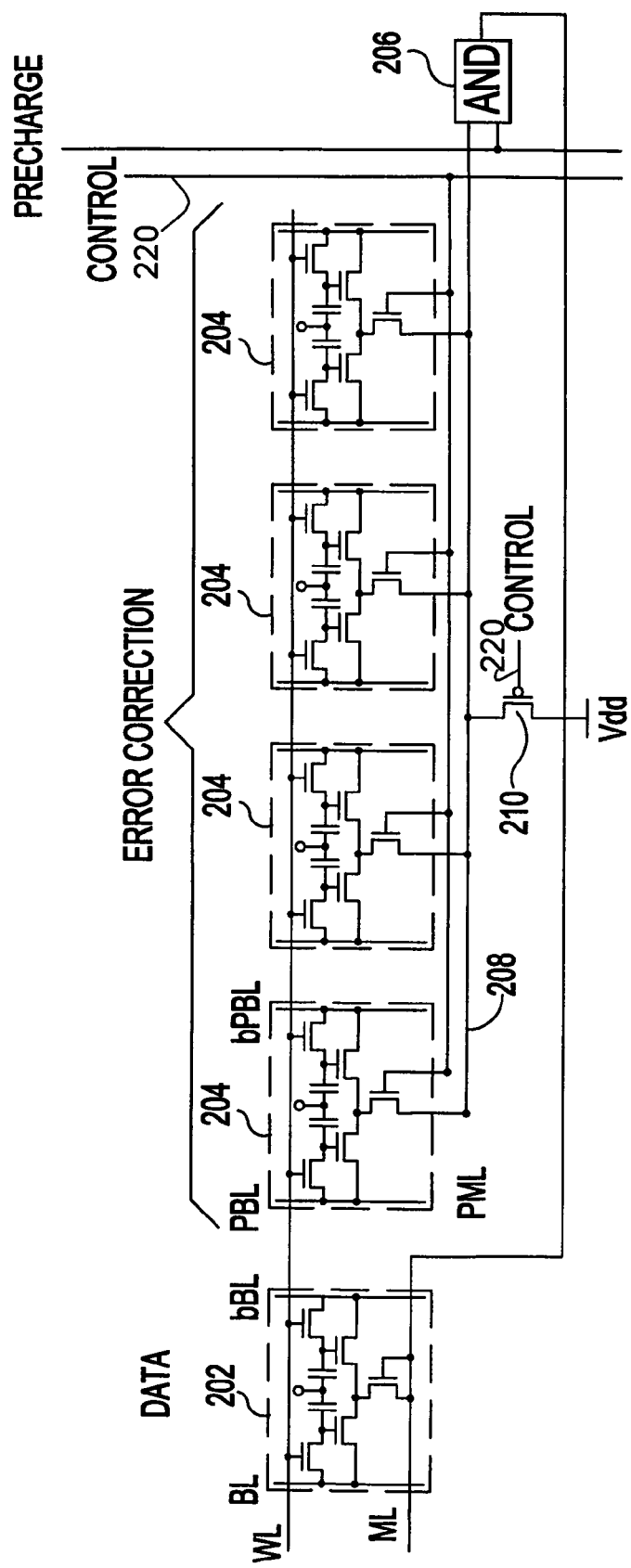
FIG. 4 shows an example of a DCAM cross section, showing a single word line of DCAM cells.

FIG. 4 shows an example of a DCAM cross section, showing a single word line 200 of DCAM cells (e.g., cell 170 of FIG. 3) in array (e.g., array 100 of FIG. 1A–B) and with a single representative data cell 202 from data area 102 and error correction cells 204 in error correction area 104. Also, a single AND gate 206 is shown representative of AND gates in match line AND area 110. As is described hereinabove inputs to the AND gate 206 include the parity match line 208 and precharge line 116. Also, as described above, control line 220 gates match devices 194 in each of the error correction cells 204. Also, the control line 220 controls a PFET 210 tied between parity match line 208 and $V_{dd}$. The output of AND gate 206 is tri-statable and provides the precharge for the corresponding data match line in the data area 102.

Figure 5:
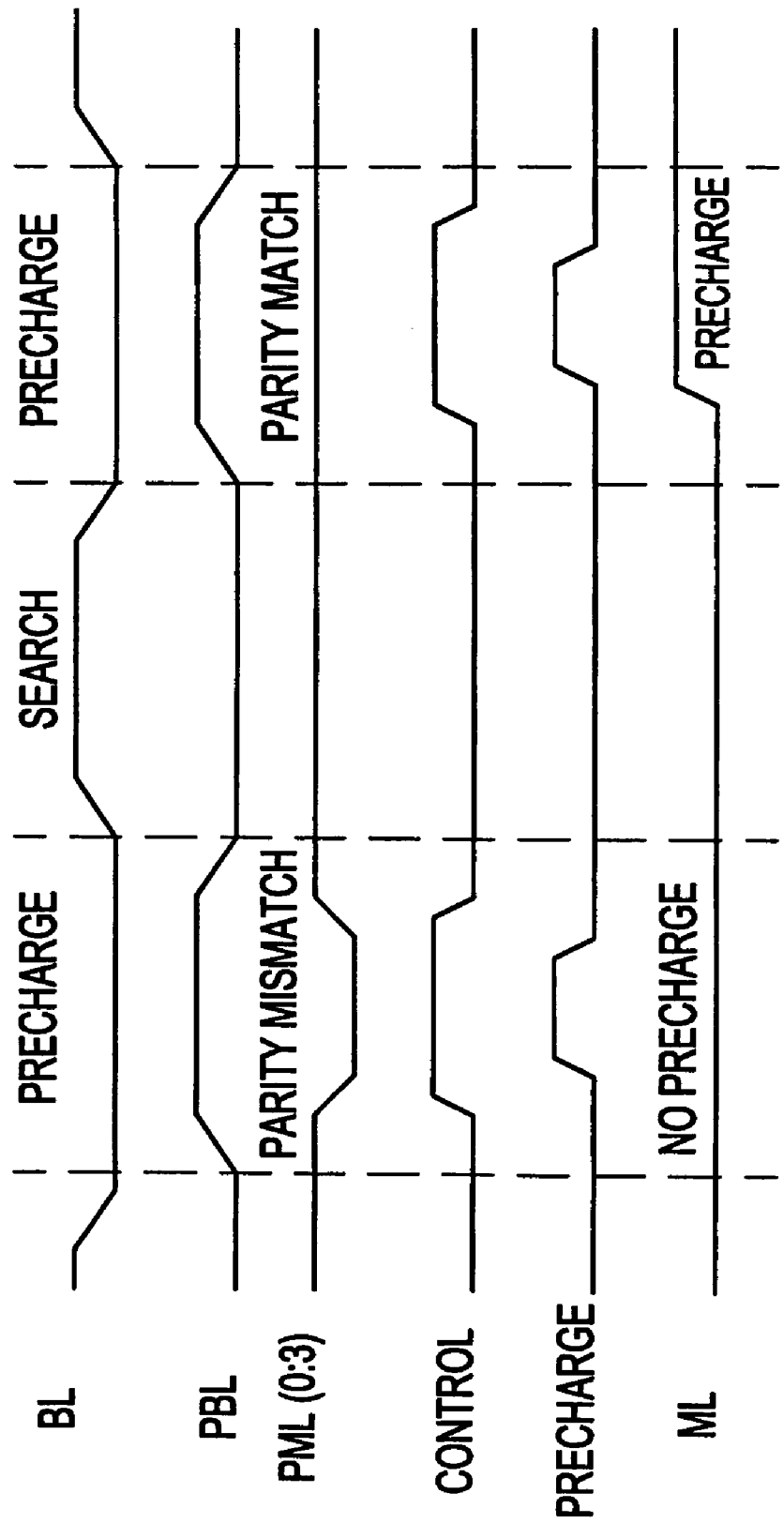
FIG. 5 is a timing diagram for operation of this example of a preferred embodiment DCAM.

FIG. 5 is a timing diagram for operation of this example of a preferred embodiment DCAM 200. Unlike the SCAM embodiment of FIG. 3, the Comparand is provided uninverted for a match. Prior to a search both bit lines in all bit line pairs are low, both in the data array 102 and in parity array 104. Also, parity match lines 108 are low and, as a result, data match lines 114 are low. Both precharge line 110 and control line 120 are low. The gate of parity read precharge PFET 210 is low pulling the parity match lines 208 high. A match begins by pulling the control line high which, correspondingly, turns off parity match precharge PFET 210, floating match lines 208. Then, the error correction value is provided to the error correction bit lines in area 104. Optionally, at this time the entire Comparand may be provided to the CAM array. A match between error correction bit lines and the cell capacitors 172, 174, indicates that the word value may match. Thus, a low bit line on whichever side corresponds to the high capacitor charge in unmatching parity cells provides a path to ground for the error correction match line, pulling or assisting in pulling the particular error correction match line low. Each error correction match line 108 remaining high is a "1" input to a corresponding AND gate 206 and, when the precharge is driven to a "1", wherever ECC matches, AND gates 206 precharge result data match lines 114 high for the corresponding data word line; the majority (i.e., those in which at least one error correction bit did not match and so, the particular error correction match line was pulled low by those one or more error correction cells) remain low. When the data match lines are driven high and the Comparand value is placed on the array the data bit lines in array 102, a normal match occurs when the cells on a precharged match line matches the Comparand value.

Figure 6:
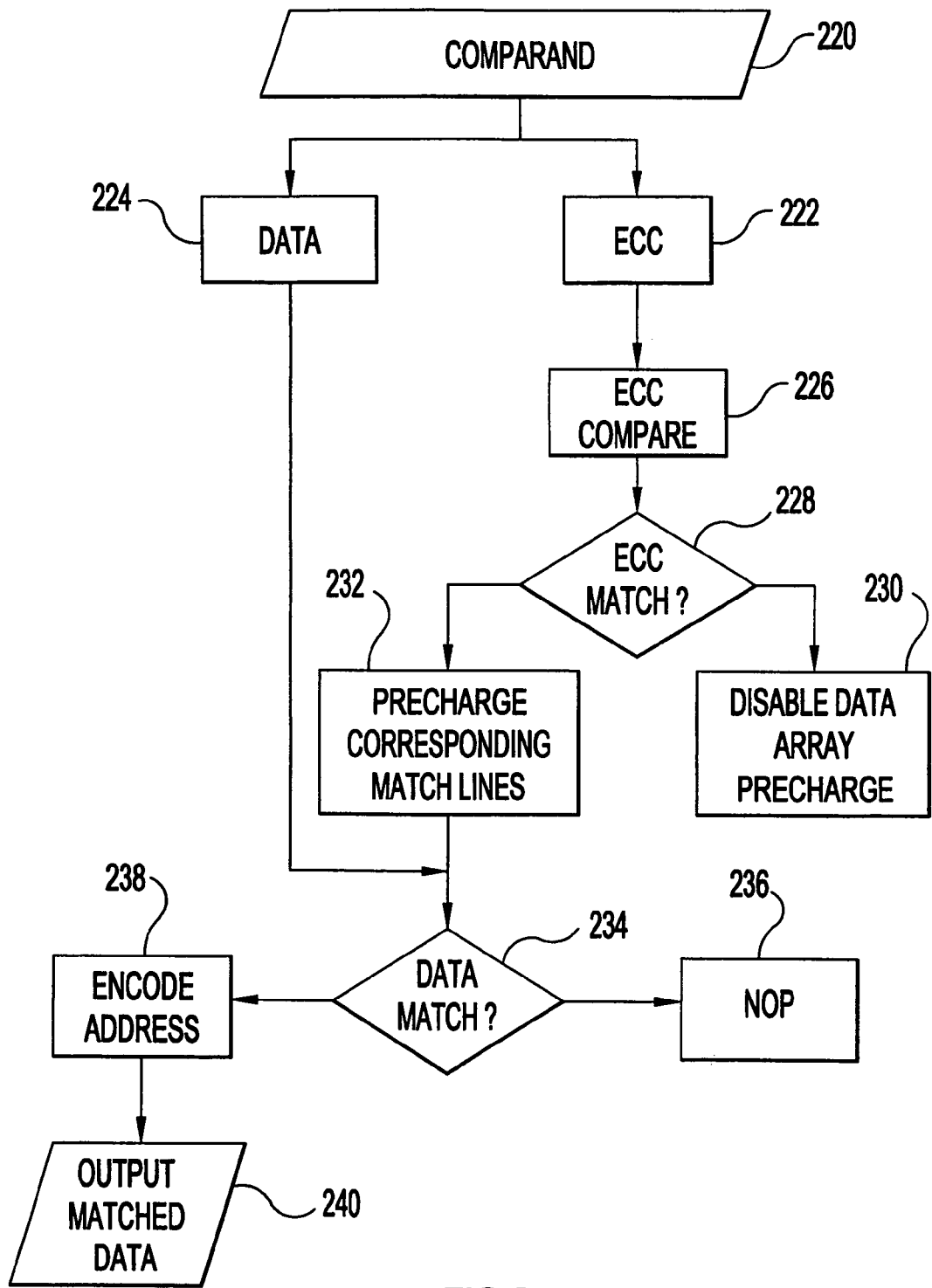
FIG. 6 shows a data flow for a preferred embodiment CAM.

FIG. 6 shows a data flow for a preferred embodiment CAM. A Comparand is provided in 220. The error correction portion is provided to error correction register 222; and, the remainder is provided to the data register 224. The Comparand error correction bits are passed to the ECC array for compare in 226. If in 228 the Comparand error correction doesn't match, then in 230 data array words for those corresponding non-matching locations are not enabled for compare. Otherwise, for those words that have matching error correction bits in 232 the match lines are precharged. The precharge data lines are checked for a match in 234. In 236 no action is taken for those data lines that do not match. However, for those locations that do match, the matching address is encoded in 238 and the output the block of data is output in 240.

Having thus described preferred embodiments of the present invention, various modifications and changes will occur to a person skilled in the art without departing from the spirit and scope of the invention. It is intended that all such variations and modifications fall within the scope of the appended claims. Examples and drawings are, accordingly, to be regarded as illustrative rather than restrictive.

What is claimed is:

1. A content addressable memory (CAM) including an array of a plurality of memory cells arranged in a plurality of words, said CAM comprising:
    a data portion of a CAM array, said data portion including a plurality of data words, each of said data words including a plurality of CAM cells connected to a word match line;
    an error correction portion of said CAM array, said error correction portion including a plurality of error correction cells, each of data words having at least one corresponding error correction cell in said error correction portion identified for storage of an error correction bit, each of said error correction cells identified for one of said data words and being connected to an error correction match line, an error correction match line being included for each said word match line; and
    a word match line precharge precharging each said word match line responsive to a corresponging said error correction match line, whereby one said word match line is precharged high responsive to said corresponding said error correction match line being high at a selected time.

2. A CAM as in claim 1 wherein CAM cells in said data portion and said error correction portion are identical.

3. A CAM as in claim 1 wherein each word match line precharge is an AND gate receiving an error correction match input from one said error correction match line and a precharge control input selects precharging selected word match lines.

4. A CAM as in claim 1 wherein said CAM array comprises a plurality of word lines, each of said word lines comprising a plurality of data cells and a plurality of error correction cells, said plurality of data cells being in said data area and said plurality of error correction cells being in said error correction area.

5. A CAM as in claim 4 wherein said error correction cells are parity cells.

6. A CAM as in claim 5 wherein each of said data words is four bytes wide.

7. A CAM as in claim 1 wherein said CAM cells are dynamic CAM cells and a Comparand is provided uninverted for a match.

8. A CAM as in claim 1 wherein a match of data bits indicates a start address for a block of code identified by said start address.

9. A CAM as in claim 8, further comprising:
an input/output (I/O) buffer passing data to and from said CAM array;
an address encoder encoding said start address responsive to a match; and
an address decoder receiving addresses and selecting CAM locations responsive to each received address.

10. A CAM as in claim 9, further comprising:
a data Comparand register passing Comparand data bits to said data portion; and
an error correction Comparand register passing Comparand error correction bits to said error correction portion, said I/O buffer passing respective portions of received Comparands to said data Comparand register and said error correction register.

11. A dynamic content addressable memory (DCAM) including an array of a plurality of dynamic memory cells arranged in a plurality of words, said DCAM comprising:
a data portion of a DCAM array, said data portion including a plurality of data words, each of said data words including a plurality of DCAM cells connected to a word match line;
an error correction portion of said DCAM array, said error correction portion including a plurality of error correction cells, each of said plurality of data words having at least one corresponding error correction cell in said error correction portion identified for storage of an error correction bit, each of said error correction cells identified for one of said data words and being connected to an error correction match line, an error correction match line being included for each said word match line; and a word match line precharge precharging each said word match line responsive to a match on a corresponding said error correction match line, whereby one said word match line is precharged high responsive to said corresponding said error correction match line being high at a selected time.

12. A DCAM as in claim 11 wherein DCAM cells in said data portion and said error correction portion are identical.

13. A DCAM as is in claim 11 wherein each word match line precharge is an AND gate receiving an error correction match input from one said error correction match line and a precharge control input selects precharging selected word match lines.

14. A DCAM as in claim 11 wherein said DCAM array comprises a plurality of word lines, each of said word lines comprising a plurality of data cells and a plurality of error correction cells, said plurality of data cells being in said data area and said plurality of error correction cells being in said error correction area.

15. A DCAM as in claim 14 wherein said error correction cells are parity cells.

16. A DCAM as in claim 15 wherein each of said data words is four bytes wide.

17. A DCAM as in claim 11 wherein a match of data bits indicates a start address for a block of code identified by said start address.

18. A DCAM as in claim 17, further comprising: an input/output (I/O) buffer passing data to and from said DCAM array; an address encoder encoding said start address responsive to a match; and an address decoder receiving addresses and selecting DCAM locations responsive to each received address.

19. A DCAM as in claim 18, further comprising: a data Comparand register passing Comparand data bits to said data portion; and an error correction Comparand register passing Comparand error correction bits to said error correction portion, said I/O buffer passing respective portions of received Comparands to said data Comparand register and said error correction register.

20. A DCAM as in claim 19 wherein said Comparand is provided uninverted for a match.

* * * * *